United States Patent [19]
Robbins et al.

[11] Patent Number: 5,197,271
[45] Date of Patent: Mar. 30, 1993

[54] METHOD AND APPARATUS FOR BACK SIDE DAMAGE OF SILICON WAFERS

[75] Inventors: John Robbins, Sherman; Ricky L. Boston, Denison, both of Tex.

[73] Assignee: Texas Instruments Incorporated, Dallas, Tex.

[21] Appl. No.: 674,822

[22] Filed: Mar. 22, 1981

Related U.S. Application Data

[62] Division of Ser. No. 378,632, Jul. 12, 1989, Pat. No. 5,006,475.

[51] Int. Cl.⁵ ............................................. B24B 1/04
[52] U.S. Cl. ................................ 51/163.1; 51/216 T; 51/7; 211/41; 211/164; 211/78
[58] Field of Search ............... 51/163.1, 216 T, 216 P, 51/316, 317, 7; 211/40, 41, 164, 78; 269/287, 57

[56] References Cited

U.S. PATENT DOCUMENTS

| | | | |
|---|---|---|---|
| 3,226,254 | 12/1965 | Reuschel | 211/41 |
| 3,486,631 | 12/1969 | Rodman | 211/41 |
| 3,610,613 | 10/1971 | Worden | 211/41 |
| 3,679,517 | 7/1973 | Schulten et al. | 51/7 |
| 3,899,815 | 6/1975 | Merle | 211/41 |
| 4,718,202 | 1/1988 | Worsham | 51/283 E |
| 4,966,549 | 10/1990 | Ohdate | 211/41 |

*Primary Examiner*—Robert A. Rose
*Attorney, Agent, or Firm*—Richard L. Donaldson

[57] ABSTRACT

A method of backside damaging a silicon semiconductor wafer by abrading the wafer in an abrasive powder is disclosed. The wafer is rotated or translated in the powder while the powder is being vibrated. A fixture holds one or more semiconductor wafers during the processing and allows the wafer to be rotated during processing if desired.

7 Claims, 5 Drawing Sheets

| TABLE 1 |||||
|---|---|---|---|---|
| BACKSIDE DAMAGE ON <100> WAFERS 1175C FOR X HOURS IN ARGON PLUS 1100C FOR 80 MINUTES IN STEAM OXIDE STRIP, 45 SECONDS SCHIMMEL ETCH |||||
| TYPE OF BSD | 1175C ARGON ANNEAL (HR) | WAFER ID | BACKSIDE NUCLEATED OISF DENSITY (CM$^{-2}$) | AVERAGE BACKSIDE NUCLEADED OISF DENSITY (CM$^{-2}$) |
|---|---|---|---|---|
| MAP | 0 | 1 | 9.2E+05 | |
| MAP | 0 | 2 | 9.5E+05 | |
| MAP | 0 | 3 | 9.7E+05 | |
| MAP | 0 | 4 | 9.9E+05 | |
| MAP | 0 | MP-0-1 | 8.9E+05 | |
| MAP | 0 | MP-0-2 | 9.2E+05 | |
| MAP | 0 | MP-0-3 | 8.2E+05 | |
| MAP | 0 | MP-0-4 | 8.3E+05 | 9.1E+05 |
| MAP | 2 | MP-2-1 | 1.5E+05 | |
| MAP | 2 | MP-2-2 | 1.4E+05 | 1.5E+05 |
| MAP | 4 | MP-4-1 | 9.2E+04 | |
| MAP | 4 | MP-4-2 | 8.1E+04 | 8.7E+04 |
| SWAM | 0 | SW-0-1 | 1.2E+05 | |
| SWAM | 0 | SW-0-2 | 1.7E+05 | |
| SWAM | 0 | SW-0-3 | 1.3E+05 | |
| SWAM | 0 | SW-0-5 | 1.0E+05 | |
| SWAM | 0 | SW-0-5 | 8.1E+04 | 1.2E+05 |
| SWAM | 0 | SW-2-1 | 4.7E+04 | |
| SWAM | 0 | SW-2-2 | 4.2E+04 | 4.5E+04 |
| SWAM | 0 | SW-4-1 | 5.9E+04 | |
| SWAM | 0 | SW-4-2 | 4.3E+04 | 5.1E+04 |
| SEG | 0 | SG-0-1 | 1.4E+05 | |
| SEG | 0 | SG-0-2 | 1.4E+05 | |
| SEG | 0 | SG-0-3 | 1.6E+05 | |
| SEG | 0 | SG-0-4 | 1.4E+05 | |
| SEG | 0 | SG-0-5 | 1.5E+05 | 1.5E+05 |
| SEG | 0 | SG-2-1 | 7.7E+04 | |
| SEG | 0 | SG-2-2 | 5.3E+04 | 6.5E+04 |
| SEG | 0 | SG-4-1 | 6.3E+04 | |
| SEG | 0 | SG-4-2 | 8.5E+04 | 7.4E+04 |

Fig. 5

| TABLE 2 |||| 
|---|---|---|---|
| BACKSIDE DAMAGE ON <111> WAFER 1100C FOR 80 MINUTES IN STEAM OXIDE STRIP, 3 MINUTES LEO'S (MODIFIED SIRTL) ETCH |||| 
| TYPE OF BSD | WAFER ID | BACKSIDE NUCLEATED OISF DENSITY ($CM^{-2}$) | AVERAGE BACKSIDE NUCLEADED OISF DENSITY ($CM^{-2}$) |
| MAP | MP-1 | 7.2E+05 | |
| MAP | MP-2 | 5.8E+05 | |
| MAP | MP-3 | 6.9E+05 | |
| MAP | MP-4 | 5.3E+05 | 6.3E+05 |
| SWAM | SW-1 | 2.1E+05 | |
| SWAM | SW-2 | 7.6E+04 | |
| SWAM | SW-3 | 8.4E+04 | |
| SWAM | SW-4 | 8.6E+04 | 1.1E+05 |
| SEG | SG-1 | 4.4E+05 | |
| SEG | SG-2 | 3.3E+05 | |
| SEG | SG-3 | 2.9E+05 | |
| SEG | SG-4 | 2.6E+05 | 3.3E+05 |

Fig. 6

METHOD AND APPARATUS FOR BACK SIDE DAMAGE OF SILICON WAFERS

This is a division of application Ser. No. 07/378,632, filed Jul. 12, 1989 now U.S. Pat. No. 5006475.

FIELD THE INVENTION

This invention relates to apparatus and methods of processing silicon wafers, and more particularity to an apparatus and method for backside damaging of silicon wafers using moving abrasive powder.

BACKGROUND OF THE INVENTION

Backside damaging of silicon semiconductor wafers to provide sources of extrinsic gettering of metallic impurities has been accomplished by several methods including liquid honing, striated extrinsic gettering, dry blast abrasive powder, phonographic techniques, spiral particle paper abrasive, laser technology, and poly silicon growth.

Liquid honing and dry blast abrasive powder systems are usually a problem from a controllability standpoint. This is due to the extremely small abrasive particle size. Smaller abrasive particles tend to agglomerate or "clump" causing clogging of abrasive lines which makes this type of backside damage inherently unstable. Lateral cracks and pits produced by this type of backside damage makes the wafer difficult to clean particles from the damaged side. The particles cause particulate wafer contamination after the polishing step which can be detrimental to wafer yields. The silica abrasive used with the dry blast system has also been known to cause silicosis under prolonged exposures.

Striated extrinsic gettering, phonographic techniques and spiral particle paper method all produce damage to silicon wafers by producing deep scratches of the wafer surface. Scratching the surface of silicon causes pits and lateral cracks in the wafer surface. A pit is formed in silicon wafers by "knocking out" pieces of silicon on the surface level. This dislodged silicon then plagues the wafer process later in the form of particulate contamination. The phonographic technique is almost unusable due to low product throughput. This technique uses a diamond tipped stylus to damage a spinning wafer by moving the stylus slowly from the center of the wafer outward producing a spiral pattern of damage.

The spiral particle paper method to backside damage wafers is not widely used due to low production throughput. This method uses a sand paper like strip to abrade the wafer by contacting the surface of the wafer with the abrasive strip and spinning the wafer in a circular path. This form of abrading leaves a mound at the center of the wafer. Polishing the wafer later produces a dimple at the center of the spiral pattern on the front surface of the wafer due to the mound on the backside of the wafer.

Laser backside damage has been pursued as an alternative to abrasive brushes, powders, and papers. Silicon is melted at the surface of the wafer which causes a poly silicon layer. The main problem with laser backside damage is during the recrystallization of the melted silicon. Melted silicon recrystallizes forming a crystal structure which resembles the original material. This is undesirable since this "erases" most of the poly silicon nature developed immediately after melting.

Poly backside damages is about the best type of backside damage known. Unfortunately it is also the most expensive and time consuming. Poly silicon is grown on the backside of wafers. This method is excellent from a particle standpoint since the backside is never subjected to abrading. Price is the major drawback to the method of backside processing.

BRIEF SUMMARY OF THE INVENTION

The invention is to a method and apparatus for backside damaging of silicon wafers by subjecting the silicon wafer to a moving abrasive powder. The wafer is submerged in silicon carbide powder and agitated by a vibrating tumbler apparatus. The submerged wafers rotate in the silicon carbide powder. Surface damage is produce on the silicon wafer without excessive scratching, particles or pits. This type of surface damage produces an increased number of stacking faults by a factor of 10 while decreasing damage density by a factor of 1000, thereby increasing wafer yield through increasing the gettering ability of the wafer. The process is inexpensive to setup and maintain in comparison to the prior art methods.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTION OF THE DRAWINGS

FIG. 5 is a table of test data used for the diagram of FIG. 4.

FIG. 6 is a table of test data for <111> oriented semiconductor wafers.

DESCRIPTION OF A PREFERRED EMBODIMENT

The invention is to a method of backside damaging of semiconductor wafer and the apparatus used in the method. Back side damage to the semiconductor wafer is accomplished by subjecting the wafer to a moving abrasive powder. One or more silicon wafers are placed in an abrasive powder, silicon carbide for example, and agitated. Agitation is accomplished by vibrating the silicon carbide which produces surface damage on the wafer without producing excessive scratching, particle or pits.

Figure 1:
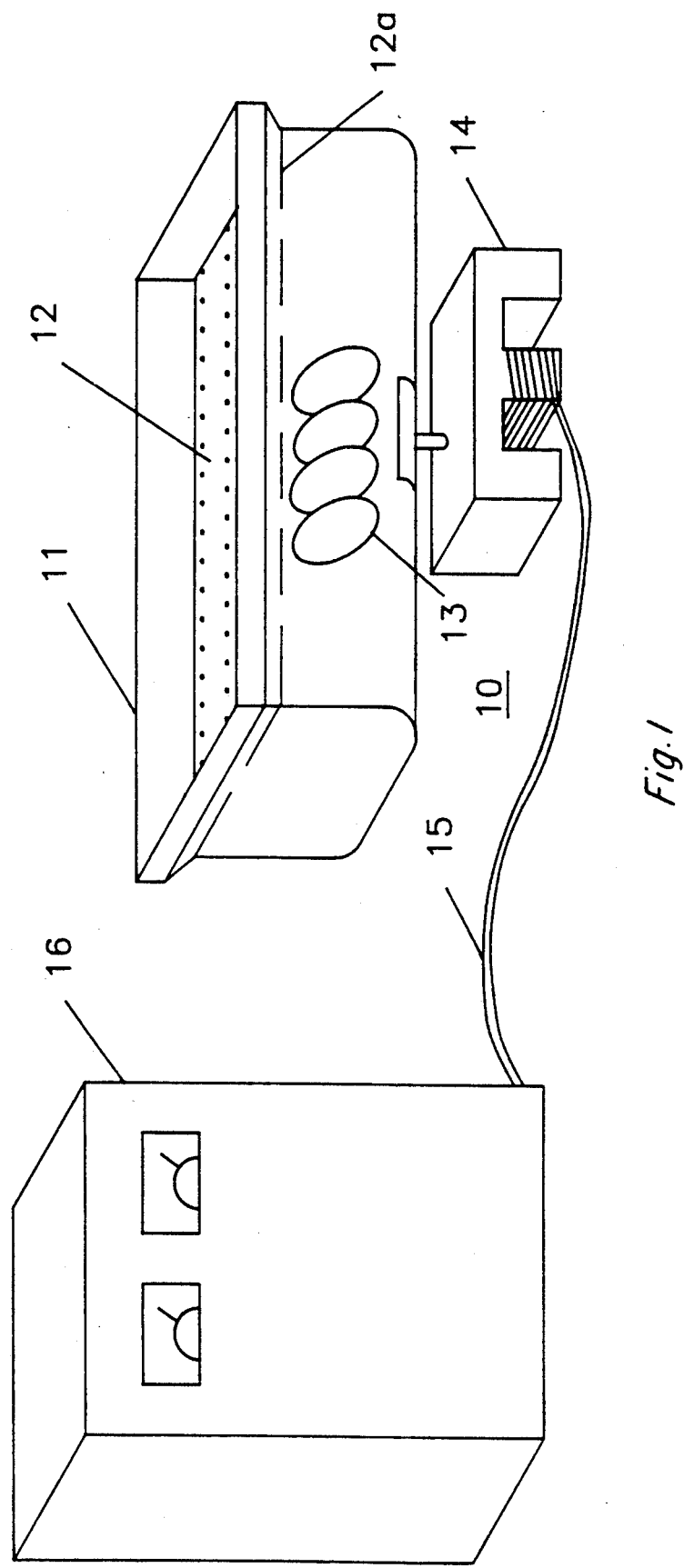
FIG. 1 illustrates apparatus used in the present invention.

FIG. 1 illustrates one embodiment of a vibrating chamber which imparts surface damage on the silicon wafer. Apparatus 10 includes a tank 11 filled with silicon carbide 12. The silicon carbide may be, for example, silicon carbide particles of 125 micron size. Tank 11 is filled to line 12a with the silicon carbide. Silicon wafers 13 are immersed in the silicon carbide powder such that the wafer are completely covered by the silicon carbide.

Tank 11 is connected to an electric vibrating coil 14. Coil 14 is connected to a power control source 16 by wire 15. The power to coil assembly 14 may be adjusted to vary the degree of vibration or agitation applied to tank 11 and the silicon carbide particles therein.

The silicon wafers are processed in the vibrating silicon carbide for, for example, one minute. The wafers are held in a fixture which rotates the wafer during processing thereby uniformly abrading the surfaces of the wafer.

Figure 2:
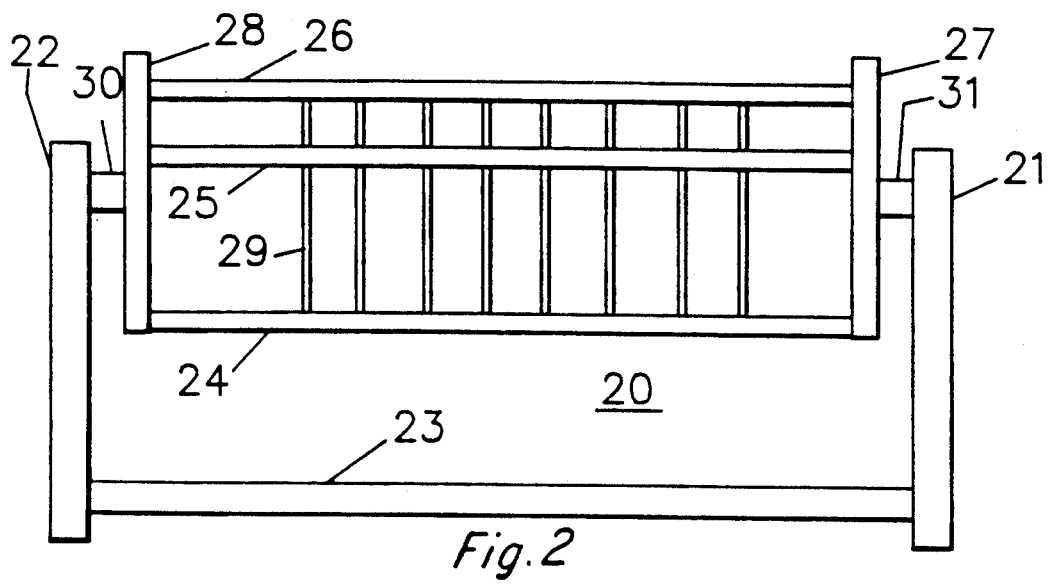
FIG. 2 illustrates a semiconductor carrier fixture to be used in the present invention.

FIG. 2 illustrates a fixture for holding a plurality of silicon wafers during the backside damage process. Fixture 20 has a handle 23 attached to the fixture-holder by two arms 21 and 22. Fixture side pieces 27 and 28 are attached to arms 21 and 22 by pins 30 and 31 such that the side pieces may rotate on pins 30 and 31.

Three rails 24, 25 and 26 extend between side pieces 27 and 28, and hold semiconductor wafers 29 in place within the fixture-holder. One or more of the rails 24, 25 and 26 is removable to allow positioning of the wafers 29 in the fixture-holder.

Figure 3:
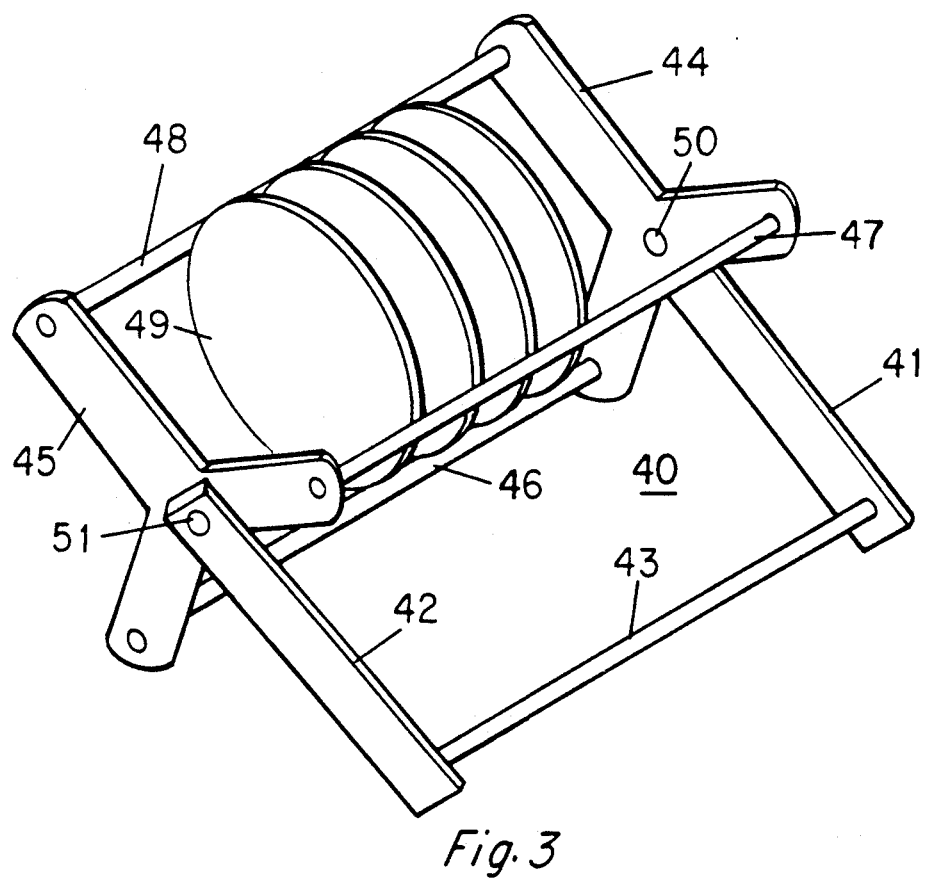
FIG. 3 is an isometric drawing of the carrier fixture of FIG. 2.

FIG. 3 is an isometric view of the fixture-holder shown in FIG. 2. Handle 23 may be a dowel extending between the two handle arms 21 and 22. Handle arms are rotatably attached to fixture-holder side pieces 28 and 27 by pins 30 and 31. Rails 24, 25 and 26, which may be dowels, extend between the side pieces 28 and 27 to hold the wafers 29 in place. As illustrated in FIG. 1, the fixture-holder, with the semiconductor wafers mounted in the fixture, is placed in a silicon carbide powder. With the semiconductor wafer completely covered with the silicon carbide, the powder is vibrated, causing the fixture holder to rotate about pins 30 and 31, causing backside damage to the wafers.

To illustrate the improvement in back side damage as a result of the present invention, a comparison of "Gettering Ability" of the present invention and prior art methods was made.

Samples of $<100>$ and $<111>$ orientation wafers were processed using the method of the present invention, MAP (Moving Abrasive Particle), and prior art methods SWAM (Silicon Wafer Abrading Machine) and SEG (Striated Extrinsic Gettering). Testing was done by means of treating the backside damaged wafers at 1100C for 80 minutes in a steam OISF test (Oxygen Induced Stacking Fault). The OISF test is believed to give a reliable method for comparing the "gettering ability" of mechanical backside damage processes because the backside OISF density is a measure of the ability of the backside damage to trap silicon self-interstitials. The greater the OISF density, the greater the ability to trap silicon self-interstitials, and the greatest ability to trap mobile impurity atoms.

For the $<100>$ samples, the evaluation sequence consisted of: an anneal at 1175C for 0, 2, or 4 hours in argon, an 1100C for 80 minutes OISF test steam oxidation, oxide strip, 45 seconds Schimmel etch, and backside OISF density counts. The 1175C argon anneals were to see how much of the damage annealed out before the OISF test.

Figure 4:
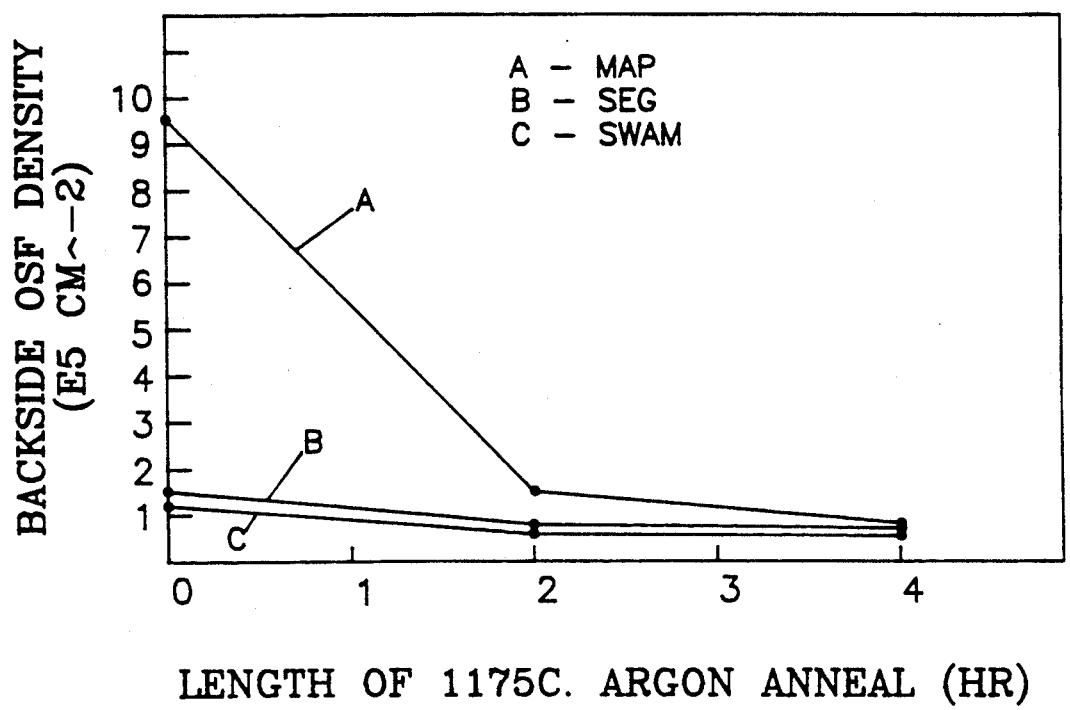
FIG. 4 is a diagram comparing three types of wafer backside damage.

FIGS. 4 and 5 (Table 1) show, for the data for the $<100>$ sample, that for no 1175C anneal, the SWAM (C) and SEG (B) produced backsides OISFs densities just over the target density of 1.0 E+05 OISFs per square centimeter, while the MAP (A) process produced OISF densities almost an order of Magnitude higher. As expected, the $<100>$ samples annealed at 1175C in argon before the OISF showed reduced densities. In all cases, the MAP samples gave the highest OISF densities, the SEG had the next highest densities, and the SWAM process yielded the lowest densities.

In evaluating the $<111>$ orientation wafers, the evaluation sequence consisted of the 1100C for 90 minutes OISF steam oxidation, oxide strip, 3 minutes of Leo's (modified Sirtl) etch, and backside OISF density counts.

The $<111>$ data, TABLE 2, show that all three types of damage gave OISF densities above the target density of 1.0 E 5 stacking faults per square centimeter. As was in the case for the $<100>$ samples, MAP produced the highest OISF density, SEG the next highest and SWAM the lowest.

The average OISF densities for no 1175C anneal can be summarized as follows:

|        | MAP   | SWAM  | SEG   |
| ------ | ----- | ----- | ----- |
| $<100>$ | 9.1E5 | 1.2E5 | 1.5E5 |
| $<111>$ | 6.3E5 | 1.1E5 | 3.3E5 |

As measured by the OISF densities, the MAP backside damage showed the best "gettering ability". The scratches produced by the MAP process are mild compared to the SEG scratches, and the MAP process appears to produce none of the "shot holes" of missing silicon that the SWAM process produces.

What is claimed:

1. A fixture for holding semiconductor wafers during backside damaging of the wafers, comprising:
   two side pieces,
   three dowel supports, and
   a handle,
   the three dowel supports connected to the two side pieces and rigidly supporting the semiconductors wafers between the three dowel supports, such that the wafers are rigidly secured between the dowel supports when the dowel supports are in place between the two side pieces, and the handle is pivotally connected to the two side pieces.

2. The fixture according to claim 1, wherein the three dowel supports are connected to the side pieces such that each dowel support contacts a semiconductor wafer on its circumference to hold the wafer in place during processing.

3. The fixture according to claim 1, wherein at least one dowel support is removable to permit mounting of the semiconductor wafers.

4. The fixture according to claim 1 wherein the handle is rotatably mounted to the side pieces.

5. A fixture for holding semiconductor wafers during backside damaging of the wafers, comprising:
   two side pieces, each side pieces having three legs extending from a center point, the legs being located equidistant around an imaginary circle having the center point as its center,
   three dowel supports extending between the legs of the side pieces, and
   a handle rotatably mounted to the side pieces,
   the three dowel supports connected to the two side pieces and supporting the semiconductors wafers between the three dowel supports and the handle connected to the two side pieces.

6. The fixture according to claim 5, wherein the three dowel supports are connected to the side pieces such that each dowel support contacts a semiconductor wafer on its circumference to hold the wafer in place during processing.

7. The fixture according to claim 6, wherein at least one dowel support is removable to permit mounting of the semiconductor wafers.

* * * * *